US007834656B2

(12) United States Patent
Takamuku

(10) Patent No.: US 7,834,656 B2
(45) Date of Patent: Nov. 16, 2010

(54) TWO-WIRE TRANSMITTER

(75) Inventor: Yayoi Takamuku, Tokyo (JP)

(73) Assignee: Yokogawa Electric Corporation, Tokyo (JP)

( * ) Notice: Subject to any disclaimer, the term of this patent is extended or adjusted under 35 U.S.C. 154(b) by 1318 days.

(21) Appl. No.: 11/302,576

(22) Filed: Dec. 13, 2005

(65) Prior Publication Data

US 2006/0154709 A1 Jul. 13, 2006

(30) Foreign Application Priority Data

Dec. 17, 2004 (JP) ............................. 2004-365960

(51) Int. Cl.
*H03K 17/16* (2006.01)
*H03K 19/003* (2006.01)

(52) U.S. Cl. ............................. 326/33; 326/86; 326/90

(58) Field of Classification Search ............. 326/31-34, 326/86, 90; 323/266, 274
See application file for complete search history.

(56) References Cited

U.S. PATENT DOCUMENTS 3,344,340 A * 9/1967 Webb ......................... 323/273
3,626,278 A * 12/1971 Matsumura et al. .......... 323/275

FOREIGN PATENT DOCUMENTS

JP 3057650 5/1993

* cited by examiner

*Primary Examiner*—Anh Q Tran
(74) *Attorney, Agent, or Firm*—Sughrue Mion, PLLC

(57) ABSTRACT

A two-wire transmitter is connected to two transmission lines which transmit an electric signal regarding a physical quantity detected by a sensor. The two-wire transmitter includes a current control section which controls a transmission current of the electric signal, and a starter circuit which starts at a starting time of the two-wire transmitter so that the transmission current flowing through the current control section under steady operation of the two-wire transmitter detours the current control section to flow through the starter circuit. The starter circuit stops when an output voltage of the current control section reaches a predetermined value or more after the two-wire transmitter starts.

12 Claims, 1 Drawing Sheet

TWO-WIRE TRANSMITTER

CROSS-REFERENCE TO RELATED APPLICATIONS

This application is based upon and claims the benefit of priority from the prior Japanese Patent Applications No. 2004-365960, filed on Dec. 17, 2004, the entire contents of which are incorporated herein by reference.

BACKGROUND OF THE INVENTION

1. Field of the Invention

This invention relates to a two-wire transmitter having a starter circuit.

2. Description of the Related Art

A two-wire transmitter in a related art generally has a starter circuit made of a time constant circuit. (For example, JP-B-3057650) At the start time, the starter circuit secures power supply and improves the stability of the transmitter. The configuration of such a two-wire transmitter in a related art will be discussed with FIG. 2. FIG. 2 is a diagram to show the configuration of the two-wire transmitter in the related art.

The configuration shown in FIG. 2 will be discussed. A two-wire transmitter 10' is connected to transmission lines L1 and L2. The two-wire transmitter 10' and the transmission lines L1 and L2 are part of a smart or a fieldbus (Fieldbus Foundation, Profibus (Trademark)).

The two-wire transmitter 10' includes current control section (30, R3) made up of a current control circuit 30 and a resistor R3 of current detection section. More particularly, for example, one end of the current control circuit 30 is connected to the transmission line L1 and an opposite end of the current control circuit 30 is connected to an internal circuit 50 through power supply section 40. Further, one end of the resistor R3 is connected, for example, to the transmission line L2 and the current control circuit 30 and an opposite end of the resistor R3 is connected to a common potential COM, the current control circuit 30, and the power supply section 40.

The two-wire transmitter 10' includes the power supply section 40 formed of a Zener diode, for example, and the internal circuit 50 having a sensor (not shown), a microprocessor (not shown), etc. More particularly, an anode of the Zener diode of the power supply section 40 is connected to the common potential COM and a cathode of the Zener diode of the power supply section 40 is connected to the opposite end of the current control circuit 30 (voltage Vcc). The microprocessor (not shown) of the internal circuit 50 is connected the power supply section 40 through a separate regulator (not shown).

In the configuration shown in FIG. 2, the power supply section 40 is formed of the Zener diode, but can also be formed using an error amplifier (not shown), etc.

The two-wire transmitter 10' further includes a starter circuit 20'. The internal configuration of the starter circuit 20' will be discussed below: A drain of an n channel depletion type field effect transistor (FET) Q4 is connected to the one end of the current control circuit 30 (transmission line L1) and a source of the FET Q4 is connected to the opposite end of the current control circuit 30.

A series circuit of resistors R5 and R6 is connected between the opposite end of the current control circuit 30 (voltage Vcc) and the common potential COM. Further, a resistor R7 is connected between the connection point of the resistors R5 and R6 and a gate of the FET Q4. A capacitor C is connected between the opposite end of the current control circuit 30 (voltage Vcc) and the gate of the FET Q4. The resistors R5, R6, and R7 and the capacitor C make up a time constant circuit.

Further, voltage at the connection point of the opposite end of the current control circuit 30, the source of the FET Q4, the resistor R5, the capacitor C, and the power supply section 40 is voltage Vcc; voltage at the connection point of the transmission Line 2, the current control circuit 30, and the resistor R3 is voltage Va; voltage at the connection point of the transmission Line 1, the one end of the current control circuit 30, and the drain of the FET Q4 is voltage Vb; voltage at the connection point of the resistors R5, R6, and R7 is voltage Vf; and voltage at the connection point of the gate of the FET Q4, the capacitor C, and the resistor R7 is voltage Vg. The common potential COM is connected to the resistors R3 and R6, the power supply section 40, the current control circuit 30, the internal circuit 50, etc.

The stationary operation of the two-wire transmitter (starter circuit) in the related art in FIG. 2 is as follows:

At this time, the FET Q4 is turned off. More particularly, since the voltage Vcc is sufficiently large, the voltage Vf becomes sufficiently large, the voltage Vg becomes sufficiently large, and the gate-source voltage of the FET Q4 (Vg−Vcc) becomes equal to or less than cutoff voltage.

Power is supplied to the two-wire transmitter 10' via the transmission lines L1 and L2. The power supply section 40 generates a predetermined voltage and supplies power to the current control circuit 30, the internal circuit 50, etc. Further, the sensor (not shown) of the internal circuit 50 generates an electric signal responsive to the detected physical quantity, and the microprocessor (not shown) of the internal circuit 50 processes the electric signal from the sensor and transmits the processed signal to the current control circuit 30.

The voltage Va proportional to the transmission current flowing into the transmission lines L1 and L2 occurs on the resistor R3. The current control circuit 30 controls so that the electric signal responsive to the detected physical quantity and the voltage Va correlate to each other.

Consequently, the current flowing into the resistor R3 becomes the current responsive to the detected physical quantity and the transmission current flowing into the transmission lines L1 and L2 also becomes the current responsive to the detected physical quantity. The two-wire transmitter 10' thus transmits the electric signal regarding the detected physical quantity to the transmission lines L1 and L2.

Next, the operation the two-wire transmitter in the related art in FIG. 2 at the starting time is as follows: Before starting, the gate of the FET Q4 (voltage vg) is pulled down with the resistors R7 and R6 and the capacitor C discharges with the resistors R7 and R5. The FET Q4, which is of depletion type, is turned on. At the starting time, as the voltage Vb rises, drain current Ist' of the FET Q4 flows. The drain current Ist' promotes the rise in the voltage Vcc. Further, the voltage Vcc rises, the voltage Vg rises, and the FET Q4 continues on.

Then, the voltage Vg lowers having the time constant of the resistors R5, R6, and R7 and the capacitor C, the gate-source voltage of the FET Q4 (Vg−Vcc) lowers and becomes equal to or less than the cutoff voltage, and the FET Q4 is turned off.

The two-wire transmitter (starter circuit) in the related art in FIG. 2 thus provides a stable start characteristic. When the starter circuit does not operate at the starting time, shortage of power supply occurs, the voltage Vcc lowers, and the two-wire transmitter in the related art in FIG. 2 may become unstable.

Japanese Patent No. 3057650 (JP-B-3057650) is referred to as a related art.

With the two-wire transmitter in the related art, however, if the voltage Vcc changes very slowly, namely, if an external power supply (not shown) connected to the transmission lines L1 and L2 starts slowly, whether or not reliable starting can be conducted is unknown; this is a problem. At this time, the time constant circuit made up of the resistors R5, R6, and R7 and the capacitor C does not function effectively.

SUMMARY OF THE INVENTION

An object of the invention is to provide a two-wire transmitter having a stable start characteristic.

The invention provides a two-wire transmitter to be connected to two transmission lines which transmit an electric signal regarding a physical quantity detected by a sensor, having: a current control section which controls a transmission current of the electric signal; and a starter circuit which starts at a start time of the two-wire transmitter so that the transmission current flowing through the current control section under steady operation of the two-wire transmitter detours the current control section to flow through the starter circuit, wherein the starter circuit stops when an output voltage of the current control section reaches a predetermined value or more after the two-wire transmitter starts.

In the two-wire transmitter, the current control section has: a current control circuit connected at one end to one of the transmission lines and at an opposite end to an internal circuit; and a current detection resistor connected at one end to the other of the transmission lines and at an opposite end to a common potential, and the starter circuit has: a comparator which compares an output voltage of the current control circuit with a reference voltage; and a switching section which is connected to the current control circuit in parallel and turns on and off according to an output of the comparator.

In the two-wire transmitter, the switch section has a pnp transistor.

In the two-wire transmitter, the transmission lines are part of a fieldbus.

According to the two-wire transmitter, the two-wire transmitter having a stable start characteristic can be provided. Further, a two-wire transmitter having a start characteristic not dependent on the power on method of an external power supply connected to the transmission lines can be provided. Further, a handy and preferred two-wire transmitter can be provided.

DETAILED DESCRIPTION OF THE PREFERRED EMBODIMENTS

Figure 1:
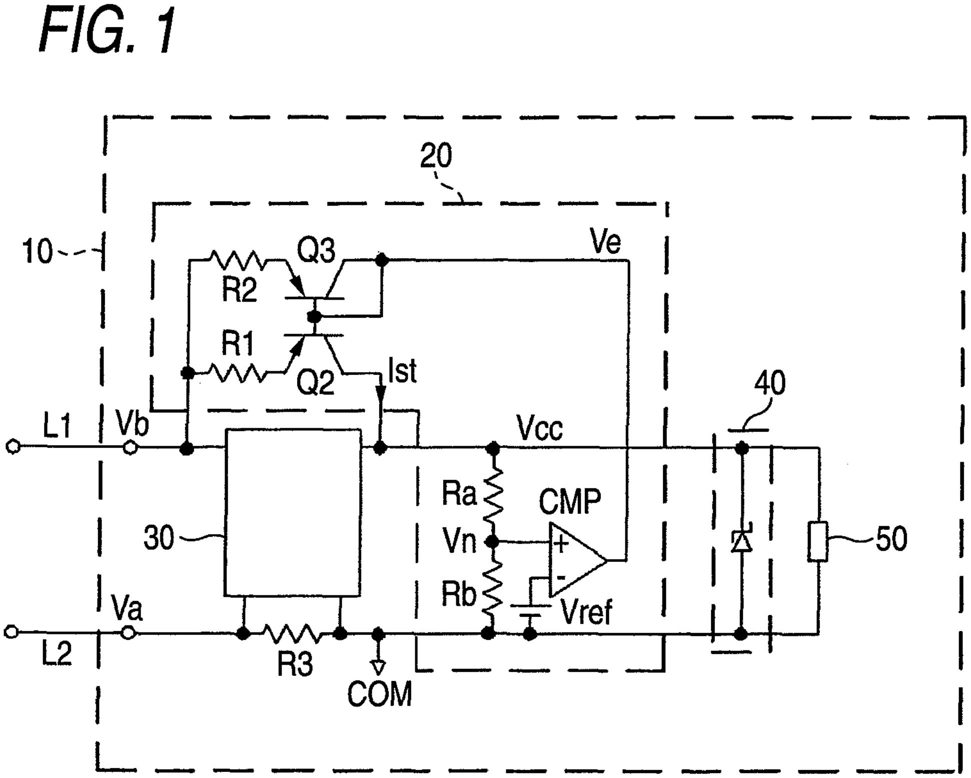
FIG. 1 is a diagram to show the configuration of an embodiment of a two-wire transmitter according to the invention.
Figure 2:
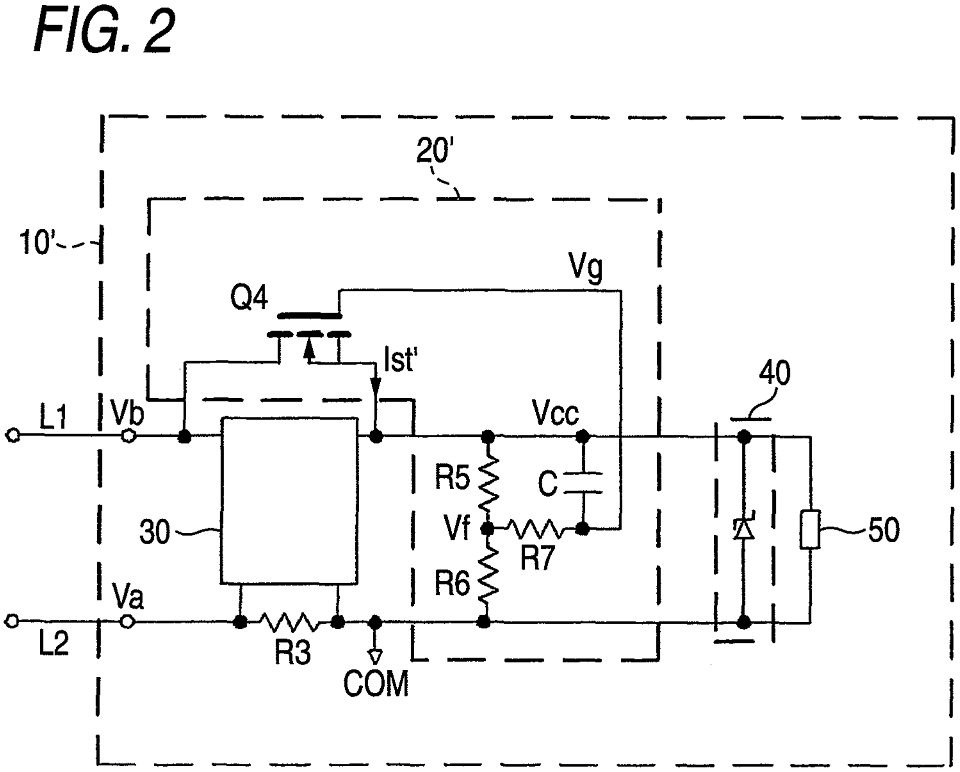
FIG. 2 is a diagram to show the configuration of a two-wire transmitter in a related art.

An embodiment according to the invention will be discussed in detail based on FIG. 1. FIG. 1 is a diagram to show the configuration of the embodiment of the invention. Elements identical with or similar to those previously described with reference to FIG. 2 in the related art are denoted by the same reference numerals in FIG. 1 and will not be discussed again.

The embodiment in FIG. 1 is characterized by the configuration of a starter circuit 20.

The configuration of the starter circuit 20 will be discussed. One end (emitter) of a pnp transistor Q2 of a switch element is connected to one end of a current control circuit 30 and a transmission line L1 (voltage Vb) through a resistor R1, and an opposite end (collector) of the transistor Q2 is connected to an opposite end (voltage Vcc) of the current control circuit 30. That is, the transistor Q2 is connected to the current control circuit 30 in parallel.

One end (emitter) of a pnp transistor Q3 is connected to one end of the current control circuit 30 and the transmission line L1 (voltage Vb) through a resistor R2, and an opposite end (collector) of the transistor Q3 is connected to the connection point of a control terminal (base) of the transistor Q2 and a control terminal (base) of the transistor Q3.

Further, a series circuit of resistors Ra and Rb is connected between the opposite end (voltage Vcc) of the current control circuit 30 and a common potential COM. Further, non-inversion input of a comparator CMP is connected to the connection point of the resistors Ra and Rb, inversion input of the comparator CMP is connected to reference voltage Vref, and output of the comparator CMP is connected to the base of the transistor Q2.

Thus, the comparator CMP makes an indirect comparison between the voltage Vcc and the reference voltage Vref. Further, the transistors Q2 and Q3 are turned on and off according to output of the comparator CMP. The voltage Vcc is divided by the resistors Ra and Rb to generate voltage Vn.

Further, voltage at the connection point of the opposite end of the current control circuit 30, the collector of the transistor Q2, the resistor Ra, and power supply section 40 is voltage Vcc; voltage at the connection point of the transmission line L1, the one end of the current control circuit 30, and resistors R1 and R2 is voltage Vb; voltage at the connection point of the base of the transistor Q2, the base of the transistor Q3, the collector of the transistor Q3, and the output of the comparator CMP is voltage Ve; and voltage at the connection point of the resistors Ra and Rb and the non-inversion input of the comparator CMP is voltage Vn.

The stationary operation in the embodiment in FIG. 1 is as follows:

At this time, both the transistors Q2 and Q3 are turned off. More particularly, since the voltage Vcc is sufficiently large, the voltage Vn becomes sufficiently large (voltage Vn>voltage Vref), output of the comparator CMP goes high, the voltage Ve becomes sufficiently large, base current of the transistor Q2 and base current of the transistor Q3 do not flow, and collector current of the transistor Q2 and collector current of the transistor Q3 do not flow.

Next, the operation in the embodiment in FIG. 1 at the starting time is as follows: Before starting, the non-inversion input of the comparator CMP (voltage Vn) is pulled down with the resistor Rb. The output of the comparator CMP goes low (voltage Vn<voltage Vref) and the voltage Ve also goes low.

At the starting time, as the voltage Vb rises, both the transistors Q2 and Q3 are turned on and collector current Ist of the transistor Q2 flows. The collector current Ist promotes the rise in the voltage Vcc. The resistors R1 and R2 suppress the upper limit of the collector current Ist.

Further, when the voltage Vcc becomes a predetermined voltage and the voltage Vn becomes a predetermined voltage (voltage Vn>voltage Vref), the output of the comparator CMP goes high, the voltage Ve goes high, and both the transistors Q2 and Q3 are turned off. That is, the starter circuit 20 stops when the output voltage of the current control section (30, R3) is equal to or greater than a predetermined value.

The embodiment in FIG. 1 thus provides a stable start characteristic. The embodiment in FIG. 1 has a start characteristic not dependent on the power on method of an external power supply connected to the transmission lines. Further, the embodiment in FIG. 1 can be formed easily.

Further, the transistor Q2 operates at it is turned on and off, and the time for the transistor Q2 to operate in an active region is short. Thus, power supply can be reliably secured at the starting time. If the transistor Q2 is a pnp type, the circuit becomes simple and the characteristic suited to a two-wire transmitter can be provided.

The starter circuit 20 of the embodiment in FIG. 1 operates not only at the starting time, but also when the voltage Vcc lowers due to some anomaly. More particularly, when Vcc lowers, immediately the output of the comparator CMP goes low, the voltage Ve also goes low, both the transistors Q2 and Q3 are turned on, and the collector current Ist flows. Lowering of the voltage Vcc is suppressed.

In the embodiment described above, if the comparator CMP has hysteresis, similar advantages are also provided. More particularly, a resistor (not shown) is provided between the non-inversion input of the comparator CMP and the output of the comparator CMP. In such an embodiment, a sill more stable start characteristic can be provided.

As is clear from the description given above, it is to be understood that the invention is not limited to the specific embodiment described above and that the invention contains various changes and modifications without departing from the spirit and scope of the invention.

What is claimed is:

1. A two-wire transmitter to be connected to two transmission lines which transmit an electric signal regarding a physical quantity detected by a sensor, the two-wire transmitter comprising:

a current control section which controls a transmission current of the electric signal; and a starter circuit which starts at a start time of the two-wire transmitter so that the transmission current flowing through the current control section under steady operation of the two-wire transmitter detours the current control section to flow through the starter circuit, wherein the starter circuit stops when an output voltage of the current control section reaches a predetermined value or more after the two-wire transmitter starts;

wherein the current control section comprises:

a current control circuit connected at one end to one of the transmission lines and at an opposite end to an internal circuit; and a current detection resistor connected at one end to the other of the transmission lines and at an opposite end to a common potential, and the starter circuit comprises:

a comparator which compares an output voltage of the current control circuit with a reference voltage; and a switching section which is connected to the current control circuit in parallel and turns on and off according to an output of the comparator.

2. The two-wire transmitter according to claim 1, wherein the switch section comprises a pnp transistor.

3. The two-wire transmitter according to claim 1, wherein the transmission lines are part of a fieldbus.

4. A two-wire transmitter comprising:

a current control section which controls a transmission current of an electric signal; and a starter circuit comprising a comparator which compares an output voltage of the current control circuit with a reference voltage; and a switching section which is connected to the current control circuit in parallel and turns on and off according to an output of the comparator.

5. The two-wire transmitter according to claim 4, wherein the current control section comprises:

a current control circuit; and a current detection resistor.

6. The two-wire transmitter according to claim 4, wherein the switching circuit comprises at least one transistor.

7. The two-wire transmitter according to claim 4, wherein the switching circuit comprises two pnp transistors.

8. The two-wire transmitter according to claim 4, further comprising:

a power supply section.

9. The two-wire transmitter according to claim 8, wherein the power supply section comprises a zener diode.

10. The two-wire transmitter according to claim 8, further comprising:

an internal circuit.

11. The two-wire transmitter according to claim 10, wherein the internal circuit generates an electric signal responsive to a detected physical quanitity.

12. The two-wire transmitter according to claim 4, further comprising:

an internal circuit which generates an electric signal responsive to a detected physical quantity.

* * * * *